(12) United States Patent
Tsuduki et al.

(10) Patent No.: US 9,155,212 B2
(45) Date of Patent: Oct. 6, 2015

(54) ELECTRONIC COMPONENT, MOUNTING MEMBER, ELECTRONIC APPARATUS, AND THEIR MANUFACTURING METHODS

(71) Applicant: CANON KABUSHIKI KAISHA, Tokyo (JP)

(72) Inventors: Koji Tsuduki, Kawasaki (JP); Takanori Suzuki, Tokyo (JP); Tadashi Kosaka, Atsugi (JP); Yasuhiro Matsuki, Atsugi (JP); Shin Hasegawa, Hadano (JP); Fujio Ito, Yokohama (JP); Hisatane Komori, Ayase (JP); Yasushi Kurihara, Komae (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 13/869,852

(22) Filed: Apr. 24, 2013

(65) Prior Publication Data

US 2013/0286566 A1    Oct. 31, 2013

(30) Foreign Application Priority Data

Apr. 27, 2012 (JP) ................................. 2012-103829
Feb. 28, 2013 (JP) ................................. 2013-039450

(51) Int. Cl.
| | |
|---|---|
| *H05K 5/00* | (2006.01) |
| *H05K 1/02* | (2006.01) |
| *H05K 3/34* | (2006.01) |
| *H01L 23/10* | (2006.01) |

(Continued)

(52) U.S. Cl.
CPC .............. *H05K 5/0091* (2013.01); *H01L 23/10* (2013.01); *H01L 27/14618* (2013.01); *H01L 23/13* (2013.01); *H01L 2224/48091* (2013.01); *H01L 2224/49171* (2013.01); *H01L 2224/73265* (2013.01); *Y10T 156/10* (2015.01)

(58) Field of Classification Search
CPC .......... H05K 1/0271; H05K 2201/068; H05K 1/0284; H05K 1/119; H05K 3/3442; H05K 3/368
USPC ........................ 361/679.01; 29/829, 841, 846
See application file for complete search history.

(56) References Cited

U.S. PATENT DOCUMENTS 3,622,419 A * 11/1971 London et al. ................... 438/64
4,604,677 A *  8/1986 Suzuki et al. ................. 361/729

(Continued)

FOREIGN PATENT DOCUMENTS

| CN | 1160984 A | 10/1997 |
|---|---|---|
| CN | 1227411 A |  9/1999 |

(Continued)

OTHER PUBLICATIONS

U.S. Appl. No. 13/869,779, filed Apr. 24, 2013, Koji Tsuduki.

(Continued)

*Primary Examiner* — Jeremy C Norris
*Assistant Examiner* — Nathan Milakovich
(74) *Attorney, Agent, or Firm* — Canon U.S.A., Inc. IP Division

(57) ABSTRACT

A base body includes a fiducial stage part provided with an inner terminal group, and an upper stage part located at a side of an outer edge of a package with respect to the fiducial stage part and protruding with respect to the fiducial stage part through a step part. A frame body is bonded to the upper stage part, and an inner edge of the frame body is located at the side of the outer edge of the package with respect to the step part.

20 Claims, 8 Drawing Sheets

(51) Int. Cl.
*H01L 27/146* (2006.01)
*H01L 23/13* (2006.01)

(56) References Cited

U.S. PATENT DOCUMENTS

| | | | | |
|---|---|---|---|---|
| 5,195,023 | A * | 3/1993 | Manzione et al. | 361/728 |
| 5,200,367 | A * | 4/1993 | Ko | 29/827 |
| 5,458,716 | A * | 10/1995 | Alfaro et al. | 156/245 |
| 5,481,136 | A * | 1/1996 | Kohmoto et al. | 257/712 |
| 5,744,863 | A | 4/1998 | Culnane | |
| 5,828,127 | A * | 10/1998 | Yamagata et al. | 257/706 |
| 6,011,697 | A * | 1/2000 | Budnaitis et al. | 361/792 |
| 6,268,231 | B1 * | 7/2001 | Wetzel | 438/48 |
| 6,611,056 | B2 * | 8/2003 | Okamoto et al. | 257/706 |
| 6,906,412 | B2 * | 6/2005 | Furukubo et al. | 257/704 |
| 6,953,891 | B2 * | 10/2005 | Bolken et al. | 174/559 |
| 6,979,595 | B1 * | 12/2005 | James et al. | 438/115 |
| 7,417,198 | B2 * | 8/2008 | Betz et al. | 174/536 |
| 7,646,094 | B2 * | 1/2010 | Suminoe | 257/737 |
| 8,053,953 | B2 * | 11/2011 | Yamada | 310/348 |
| 8,058,720 | B2 * | 11/2011 | Chen et al. | 257/691 |
| 8,217,556 | B2 | 7/2012 | Yamada | |
| 8,243,461 | B2 * | 8/2012 | Uchida et al. | 361/760 |
| 8,816,574 | B2 | 8/2014 | Yamada | |
| 8,823,248 | B2 | 9/2014 | Yamada | |
| 2002/0020916 | A1 | 2/2002 | Ito | |
| 2003/0161109 | A1 | 8/2003 | Kukihaka | |
| 2004/0177984 | A1 * | 9/2004 | Groothuis et al. | 174/52.4 |
| 2005/0174469 | A1 | 8/2005 | Cho et al. | |
| 2007/0200053 | A1 | 8/2007 | Nomura et al. | |
| 2008/0132002 | A1 * | 6/2008 | Inao et al. | 438/116 |
| 2008/0134631 | A1 * | 6/2008 | Kuboi | 53/81 |
| 2008/0292308 | A1 | 11/2008 | Iwabuchi | |
| 2009/0230486 | A1 * | 9/2009 | Shimodaira | 257/415 |
| 2010/0171397 | A1 | 7/2010 | Yamada | |
| 2010/0315938 | A1 * | 12/2010 | Ascanio et al. | 369/126 |
| 2012/0187803 | A1 | 7/2012 | Yamada | |
| 2013/0001398 | A1 * | 1/2013 | Wada et al. | 250/206.1 |
| 2013/0105205 | A1 * | 5/2013 | Takagi | 174/257 |
| 2013/0214405 | A1 * | 8/2013 | Bauer et al. | 257/692 |
| 2013/0241364 | A1 | 9/2013 | Yamada | |
| 2013/0242524 | A1 * | 9/2013 | Chan | 361/813 |
| 2014/0237805 | A1 * | 8/2014 | Suzuki et al. | 29/592.1 |
| 2014/0240588 | A1 * | 8/2014 | Sakuragi et al. | 348/373 |
| 2014/0252569 | A1 * | 9/2014 | Ikuma et al. | 257/659 |
| 2014/0268594 | A1 * | 9/2014 | Wang et al. | 361/749 |
| 2014/0306582 | A1 * | 10/2014 | Matsuzawa et al. | 310/366 |

FOREIGN PATENT DOCUMENTS

| | | | |
|---|---|---|---|
| CN | 1461053 | A | 12/2003 |
| CN | 1691344 | A | 11/2005 |
| CN | 101312206 | A | 11/2008 |
| CN | 101853827 | A | 10/2010 |
| GB | 2007911 | A | 5/1979 |
| JP | S62217640 | A | 9/1987 |
| JP | S62273768 | A | 11/1987 |
| JP | H02291153 | A | 11/1990 |
| JP | 4-123462 | A | 4/1992 |
| JP | H09172554 | A | 10/1997 |
| JP | 11354587 | A * | 12/1999 ............ H01L 21/60 |
| JP | 2001-168443 | A | 6/2001 |
| JP | 2001-308442 | A | 11/2001 |
| JP | 2002-299486 | A | 10/2002 |
| JP | 2003-101042 | A | 4/2003 |
| JP | 2006-245090 | A | 9/2006 |
| JP | 2007-208045 | A | 8/2007 |
| JP | 2007-242908 | A | 9/2007 |
| JP | 2008-245244 | A | 10/2008 |
| JP | 2011-077080 | A | 4/2011 |
| JP | 2011-165745 | A | 8/2011 |
| RU | 2198949 | C2 | 2/2003 |
| WO | 2011043493 | A1 | 4/2011 |
| WO | 2013/118501 | A1 | 8/2013 |

OTHER PUBLICATIONS

U.S. Appl. No. 13/869,829, filed Apr. 24, 2013, Koji Tsuduki.

* cited by examiner

ELECTRONIC COMPONENT, MOUNTING MEMBER, ELECTRONIC APPARATUS, AND THEIR MANUFACTURING METHODS

BACKGROUND OF THE INVENTION

1. Field of the Invention

The present disclosure relates to an electronic component including a package that houses an electronic device.

2. Description of the Related Art

An electronic device such as a semiconductor element is housed in a package having an inner terminal and an outer terminal, and is first-mounted as an electronic component in which the electronic device is electrically connected with the inner terminal. The electronic component is fixed to a wiring board, and is second-mounted as an electronic module in which the outer terminal is connected with the wiring board. The electronic module is installed in an electronic apparatus.

Japanese Patent Laid-Open No. 2008-245244 discloses an image pickup element package, in which a substrate having an image pickup element chip mounted thereon and an optical member close both ends of a hole that is provided in a support body and that serves as an optical path. The support body and the substrate are bonded, and the support body and the optical member are bonded, respectively by using adhesives.

With the structure as disclosed in Japanese Patent Laid-Open No. 2008-245244, the adhesive that is used for bonding the substrate and the support body may be spread on the substrate, and the adhesive that is used for bonding the optical member and the support body may drip on the substrate. If the adhesives contact an electrode pad or a metal wire for connection of the image pickup element provided on the substrate, the electrode pad may be corroded and the metal wire may be broken. Such phenomena may result in a serious problem relating to the reliability of the electronic component and the yield when the electronic component is manufactured.

As a countermeasure for such phenomena, the substrate and the support body may be bonded at a position sufficiently separated from the electrode pad and the metal wire. However, this countermeasure may result in a needless increase in size of the image pickup element package.

SUMMARY OF THE INVENTION

A first aspect of this disclosure is an electronic component, including an electronic device; and a package that houses the electronic device. The package includes a base body to which the electronic device is fixed, a lid body that faces the electronic device, and a frame body that encloses a space between the lid body and the base body. The base body includes a fiducial stage part having a terminal arranged thereon, the terminal being electrically connected with the electronic device, and an upper stage part located at a side of an outer edge of the package with respect to the fiducial stage part and protruding with respect to the fiducial stage part through a step part. The frame body is bonded to the upper stage part, and an inner edge of the frame body is located at the side of the outer edge of the package with respect to the step part.

A second aspect of this disclosure is a mounting member having a region for disposing an electronic device thereon, including a base body having the region; and a frame body that is bonded to the base body. The base body includes a fiducial stage part having a terminal arranged thereon, the terminal being electrically connected with the electronic device, and an upper stage part located at a side of an outer edge of the mounting member with respect to the fiducial stage part and protruding with respect to the fiducial stage part through a step part. The frame body is bonded to the upper stage part, and an inner edge of the frame body is located at the side of the outer edge of the mounting member with respect to the step part.

A third aspect of this disclosure is a manufacturing method of a mounting member having a region for disposing an electronic device thereon, including preparing a base body having the region and a frame body; and bonding the base body and the frame body with an adhesive. The base body includes a fiducial stage part having a terminal arranged thereon, the terminal being electrically connected with the electronic device, and an upper stage part located at a side of an outer edge of the base body with respect to the fiducial stage part and protruding with respect to the fiducial stage part through a step part. In the bonding, the frame body is bonded to the upper stage part so that an inner edge of the frame body is located at the side of the outer edge of the base body with respect to the step part.

A fourth aspect of this disclosure is a manufacturing method of an electronic component including an electronic device and a lid body that faces the electronic device, including mounting the electronic device on a mounting member formed by bonding a base body and a frame body; and bonding a lid body and the frame body with an adhesive. The base body includes a fiducial stage part having a terminal arranged thereon, the terminal being electrically connected with the electronic device, and an upper stage part located at a side of an outer edge of the mounting member with respect to the fiducial stage part and protruding with respect to the fiducial stage part through a step part. In the bonding, an inner edge of the frame body is located at the side of the outer edge of the base body with respect to the step part.

Further features of the present invention will become apparent from the following description of exemplary embodiments with reference to the attached drawings.

DESCRIPTION OF THE EMBODIMENTS

Figure 1A:
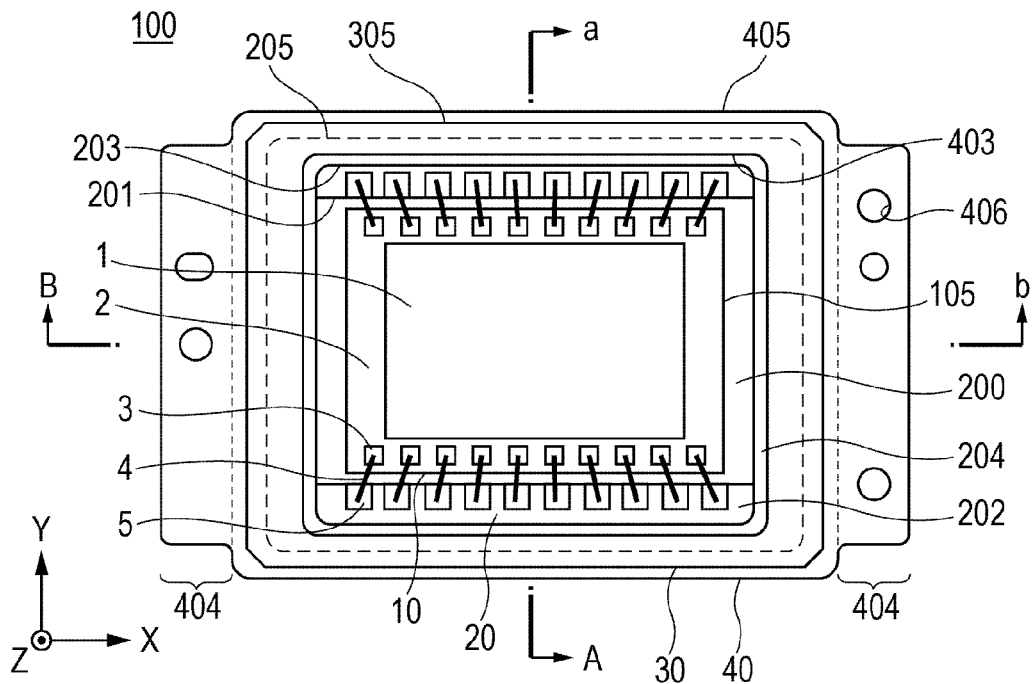
FIGS. 1A and 1B are schematic plan views of an example of an electronic component.
Figure 1B:
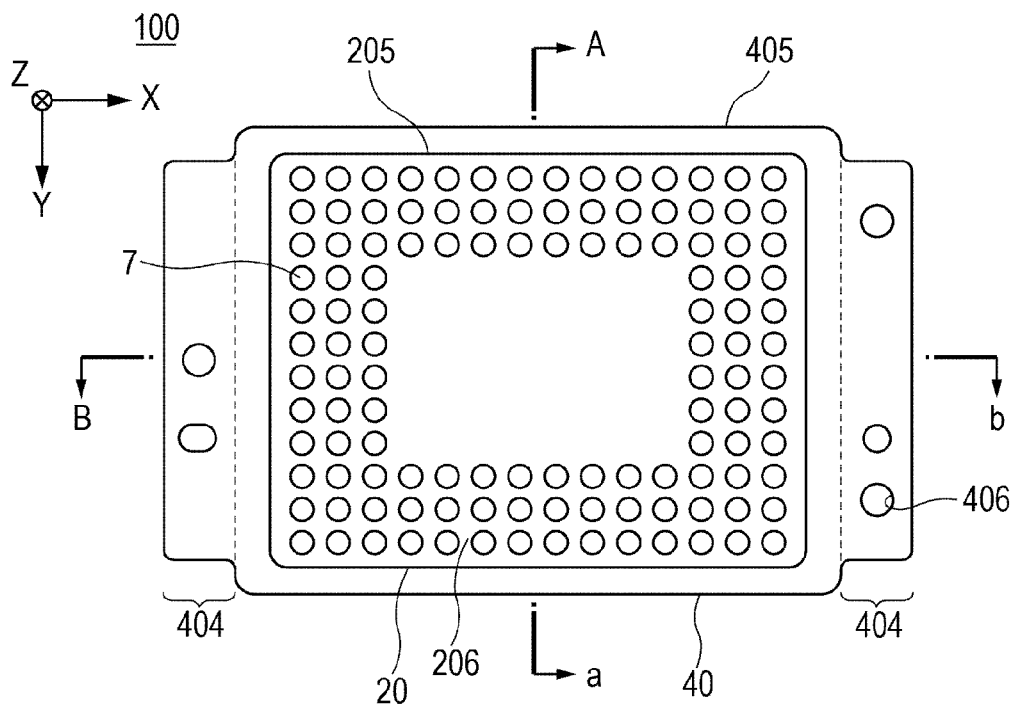
Figure 2A:
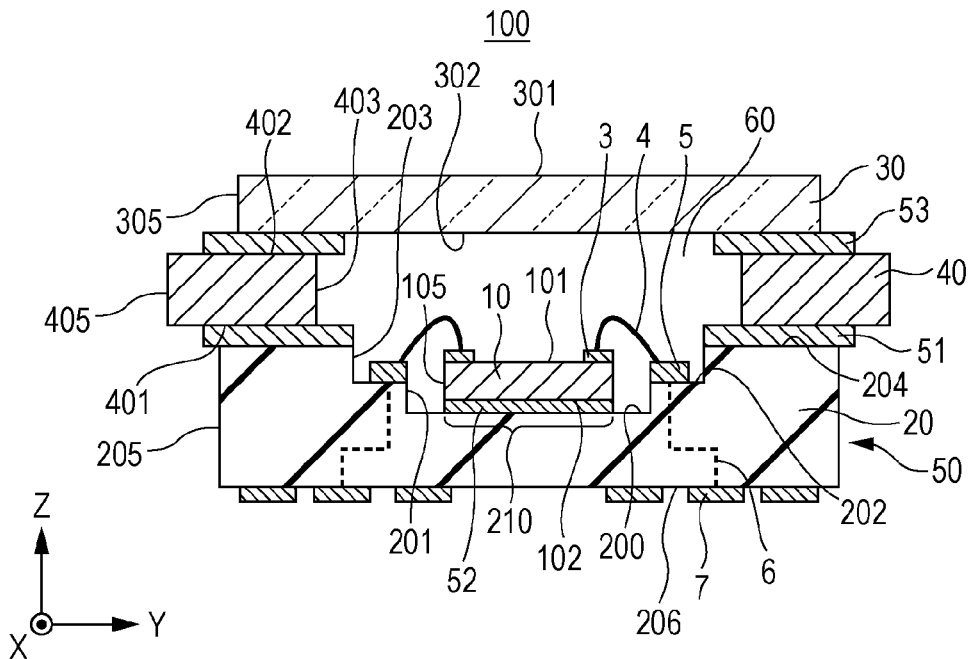
FIGS. 2A and 2B are schematic sectional views of the example of the electronic component.
Figure 2B:
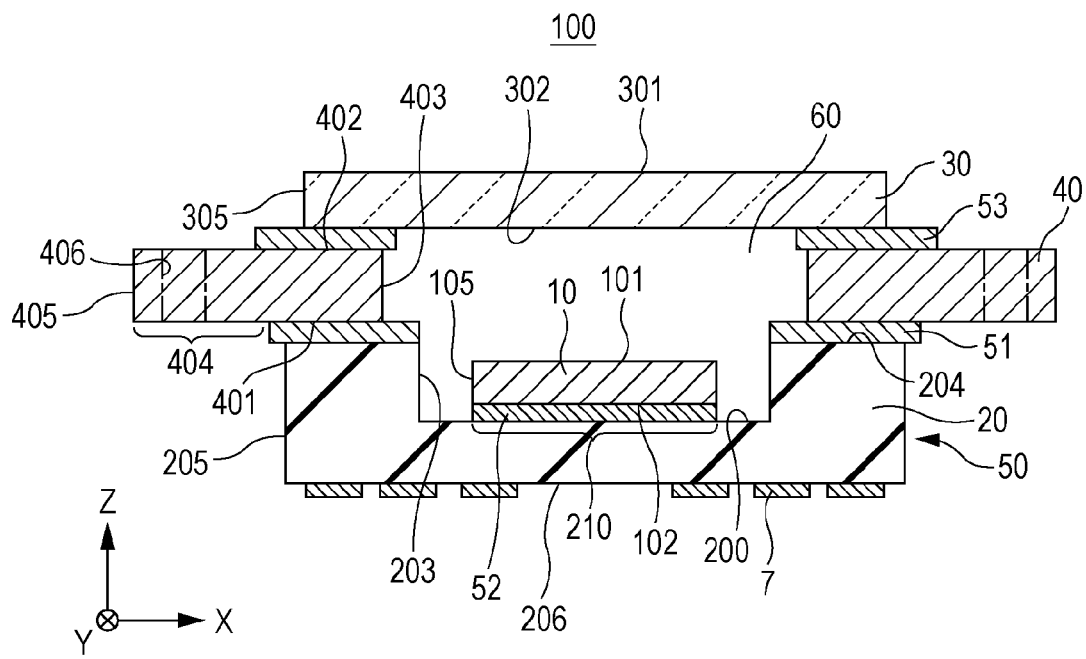
Figure 3A:
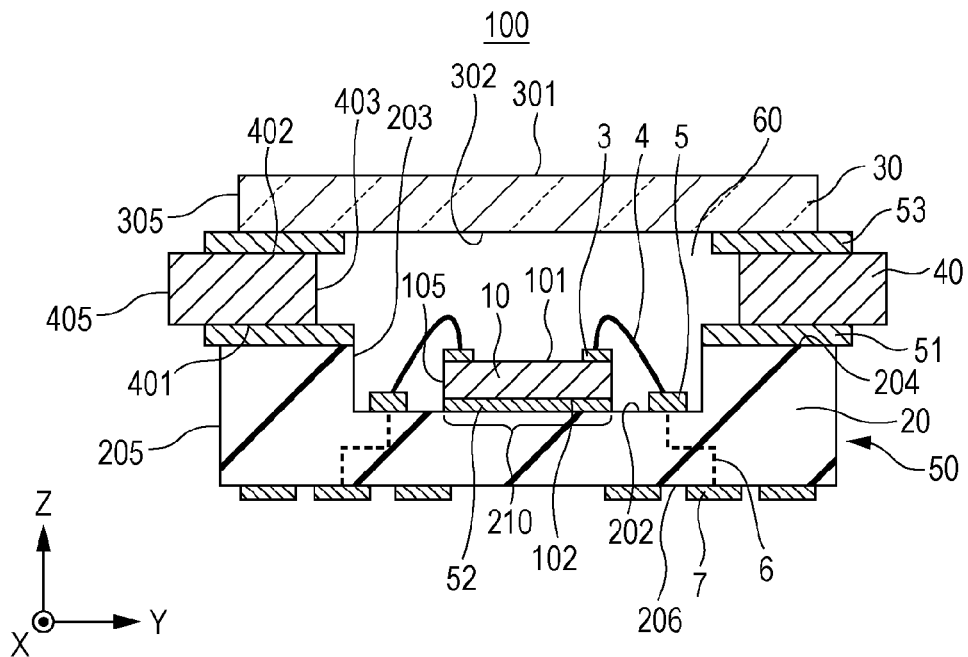
FIGS. 3A and 3B are schematic sectional views of an example of an electronic component.
Figure 3B:
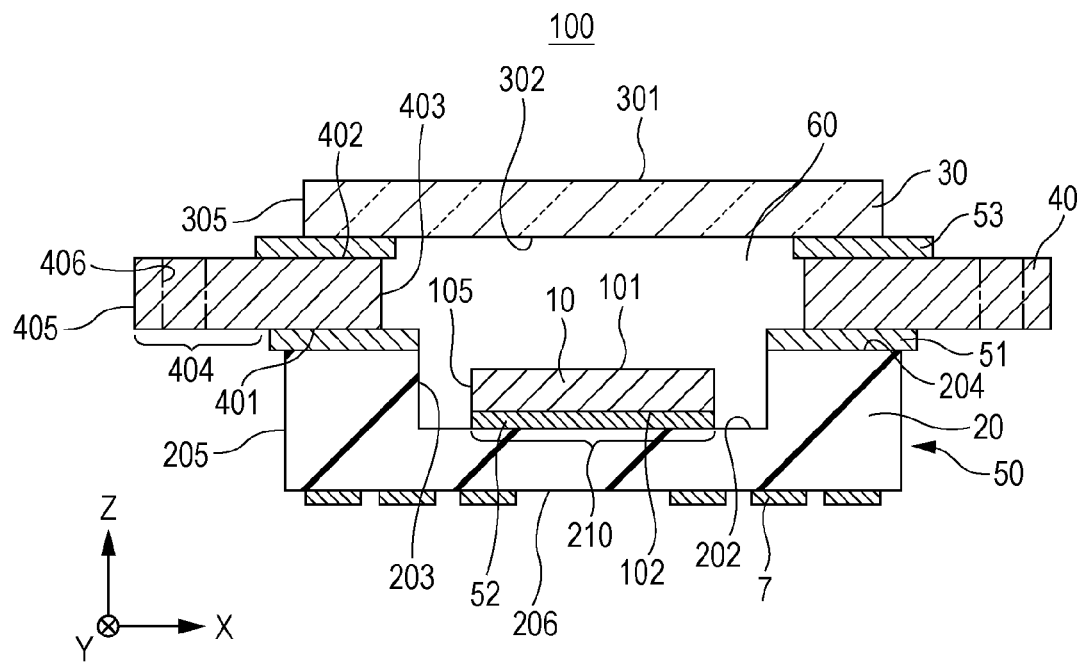

Examples of electronic components 100 are described as embodiments of the present disclosure. FIG. 1A is a schematic plan view when an electronic component 100 of a first example is viewed from the front. FIG. 1B is a schematic plan view when the electronic component 100 of the first example is viewed from the back. FIGS. 2A and 2B are schematic sectional views of the electronic component 100 of the first example. FIG. 2A is a sectional view of the electronic component 100 of the first example taken along line A-a in FIGS. 1A and 1B. FIG. 2B is a sectional view of the electronic component 100 of the first example taken along line B-b in FIGS. 1A and 1B. FIGS. 3A and 3B are sectional views of an electronic component 100 of a second example, which is a modification of the electronic component 100 of the first example, taken along lines similar to those of FIGS. 2A and 2B. The electronic component 100 of the first example is mainly described below with reference to the drawings while common reference signs are applied to the same or similar parts. The respective drawings indicate the X direction, Y direction, and Z direction.

The electronic component 100 includes an electronic device 10, and a package 50 that houses the electronic device 10. The package 50 mainly includes a base body 20, a lid body 30, and a frame body 40. Although the detail is described later, the base body 20 and the frame body 40 from among parts of the package 50 may function as a mounting member. The lid body 30 may function as an optical member. The frame body 40 has an opening that corresponds to the electronic device 10. The electronic device 10 is fixed to the base body 20. The lid body 30 is fixed to the base body 20 through the frame body 40. The lid body 30 faces the electronic device 10 through an inner space 60. The frame body 40 encloses the inner space 60 between the lid body 30 and the electronic device 10. In other words, the inner space 60 is formed in the opening of the frame body 40.

The positional relationship among members that form the electronic component 100 can be explained on the basis of a reference plane relating to the position of the electronic device 10. The reference plane is an imaginary plane that is located between a front surface 101 of the electronic device 10 and a back surface 102 of the electronic device 10 and penetrates through an outer edge 105 of the electronic device 10. The front surface 101 is located at one side of the reference plane (the side of the front surface), and the back surface 102 is located at the other side of the reference plane (the side of the back surface). The reference plane is a plane along the X-Y direction, and the Z direction is a direction perpendicular to the reference plane. If the electronic device 10 is a semiconductor device, the reference plane may be set at the interface between a semiconductor layer and an insulator layer for convenience of arrangement. The X direction and Y direction are typically parallel to a front surface 101 of the electronic device 10, a back surface 102 of the electronic device 10, an outer surface 301 of the lid body 30, and an inner surface 302 of the lid body 30. The electronic device 10 is bonded to the base body 20 such that the front surface 101 faces the inner surface 302, and the back surface 102 faces an arrangement region 210 of the base body 20. Also, the Z direction is perpendicular to the front surface 101, the back surface 102, the outer surface 301, and the inner surface 302. The electronic device 10 and the electronic component 100 typically have rectangular shapes in the X direction and Y direction. Also, the dimensions in the Z direction are smaller than the dimensions in the X direction and Y direction. Hence, the electronic device 10 and the electronic component 100 have substantially flat plate shapes. Hereinafter, a dimension in the Z direction is called thickness or height for convenience of description. Here, an orthogonal projection region is described. An orthogonal projection region of a certain member is a region in which the member can be projected in the Z direction perpendicular to the reference plane. A situation in which another member different from the certain member is located in the orthogonal projection region of the certain member represents that the certain member overlaps the other member in the Z direction. That is, if the other member is located within the orthogonal projection region of the certain member, it can be said that the other member is located in a region in which the other member overlaps the certain member in the Z direction. In contrast, if the other member is located outside the orthogonal projection region of the certain member, it can be said that at least part of the other member is located in a region in which the at least part of the other member does not overlap the certain member. The boundary between the inside and outside of an orthogonal projection region corresponds to the outer edge or inner edge (inner edge may not be present) that is the outline of a subject member. For example, the lid body 30 that faces the electronic device 10 is located in an orthogonal projection region of the electronic device 10, i.e., a region in which the lid body 30 overlaps the electronic device 10 in the Z direction.

In the X direction and Y direction, an outer edge of the electronic component 100 is determined by an outer edge 205 of the base body 20, an outer edge 405 of the frame body 40, and an outer edge 305 of the lid body 30. The frame body 40 has an inner edge 403 in addition to the outer edge 405. The opening of the frame body 40 is determined by the inner edge 403.

The type of the electronic device 10 is not particularly limited; however, is typically an optical device. The electronic device 10 of this example includes a main part 1 and a sub-part 2. The main part 1 is typically located at the center of the electronic device 10, and the sub-part 2 is typically located in the periphery of the main part 1. If the electronic device 10 is an image pickup device, such as a charge-coupled device (CCD) image sensor or a complementary metal-oxide semiconductor (CMOS) image sensor, the main part 1 is an image pickup region. If the electronic device 10 is a display device, such as a liquid crystal display or an electroluminescence (EL) display, the main part 1 is a display region. In the case of the image pickup device, the front surface 101 being a facing surface of the electronic device 10 facing the lid body 30 serves as a light incidence surface. This light incidence surface may be formed by a top layer of a multi-layer film provided on a semiconductor substrate having a light receiving surface. The multi-layer film includes layers having optical functions, such as a color filter layer, a microlens layer, an antireflection layer, and a light shielding layer; a layer having a mechanical function such as a planarizing layer; and a layer having a chemical function such as a passivation layer. The sub-part 2 has a driving circuit that drives the main part 1, and a signal processing circuit that processes a signal from the main part 1 (or a signal to the main part 1). If the electronic device 10 is a semiconductor element, such circuits are easily formed in a monolithic manner. The sub-part 2 has electrodes 3 (electrode pads) that allow the electronic device 10 to exchange signals with an external device.

At least part of a center region of the base body 20 is the arrangement region 210. The electronic device 10 is arranged on the arrangement region 210. The electronic device 10 is fixed to the base body 20. As shown in FIGS. 2A and 2B, the electronic device 10 is typically fixed through a jointing material 52 that is arranged between the arrangement region 210 of the base body 20 and the back surface 102 of the electronic device 10. Alternatively, the jointing material 52 may contact only the outer edge 105 that is a side surface of the electronic device 10 and the jointing material 52 may not be provided between the arrangement region 210 of the base body 20 and the back surface 102 of the electronic device 10. The jointing material 52 may be a conductive or insulating material. Also, the jointing material 52 desirably has high thermal conductance, and may contain metal particles.

The base body 20 includes an inner terminal 5 facing the inside (the inner space 60) of the package 50 and an outer terminal 7 facing the outside of the package 50. A plurality of the inner terminals 5 are arrayed and form an inner terminal group. In this example, as shown in FIG. 1A, an inner terminal group includes ten inner terminals 5 arrayed in a line along the X direction, and two such lines (two groups) of the inner terminal groups are arranged in the Y direction. The arrangement of the inner terminals 5 is not limited to the above-described arrangement, and an inner terminal group may include inner terminals arrayed in a line along the Y direction, and two such lines of the inner terminal groups may be arranged in the X direction. Also, two lines of inner terminal groups each including inner terminals 5 arrayed in a line along the Y direction, and two lines of inner terminal groups each including inner terminals 5 arrayed in a line along the X direction may be arranged to surround the electronic device 10. Also, a plurality of the outer terminals 7 form an outer terminal group. In this example, as shown in FIG. 1B, the outer terminal group including the outer terminals arrayed in rows and columns along the X direction and Y direction is arranged on a back surface 206 of the base body 20, the back surface 206 forming the back side of the electronic component 100. The arrangement of the outer terminals 7 is not limited to the above-described arrangement. Outer terminal groups may be arranged in lines in the X direction and/or Y direction along the outer edge 205 that is the side surface of the base body 20.

The inner terminals 5 and the outer terminals 7 are electrically continued through an embedded part 6 that is embedded as inner wiring in the base body 20. The electrodes 3 of the electronic device 10 and the inner terminals 5 of the package 50, which form the electronic component 100, are electrically connected through connection conductors 4. In this example, the electrodes 3 are connected with the inner terminals 5 by wire bonding connection, and the connection conductors 4 are metal wires (bonding wires). Alternatively, the electrodes 3 may be connected with the inner terminals 5 by flip-chip connection. In this case, the electrodes 3 are provided on the back surface 102 of the electronic device 10, and the inner terminals 5 and the connection conductors 4 are located in the arrangement region 210. In this example, the form of the outer terminals 7 is a land grid array (LGA). Alternatively, the form may be a pin grid array (PGA), a ball grid array (BGA), or a leadless chip carrier (LCC). With such a form, the plurality of outer terminals 7 may be located in an orthogonal projection region of the lid body 30 on the base body 20. Further, part of the plurality of outer terminals 7 may be located in an orthogonal projection region of the electronic device 10 on the base body 20. In this way, the plurality of outer terminals 7 may be arranged in a region where the outer terminals 7 overlap at least one of the electronic device 10, the base body 20 and the lid body 30 in the Z direction. The inner terminals 5, the embedded part 6, and the outer terminals 7 may be integrated by using a leadframe. In this case, the inner terminals 5 serve as an inner lead, and the outer terminals 7 serve as an outer lead. In a form of using the leadframe, the plurality of outer terminals 7 project from the outer edge 205 of the base body 20, and located out of an orthogonal projection region of the electronic device 10 or on the base body 20. The outer terminals 7 of the electronic component 100 are electrically connected with connection terminals of a wiring member of, for example, a printed wiring board, and at the same time are fixed to the wiring member. The outer terminals 7 may be electrically connected with an external circuit by reflow soldering with use of solder paste. In this way, the electronic component 100 is second-mounted on the wiring member and hence forms an electronic module. The electronic module may be also used as an electronic component. The mounting form is desirably surface mounting. By installing the electronic module in a housing, an electronic apparatus is formed.

The base body 20 has a concave shape, where the center region of the base body 20 is recessed with respect to a peripheral region that encloses the center region. More specifically, a plate-shaped part forms a bottom part, which is the center region of the concave shape, and a frame-shaped part provided on the peripheral region of the plate-shaped part forms a side part, which is the peripheral region of the concave shape. The base body 20 may be formed by stacking a plate member and a frame member. Alternatively, the base body 20 may be integrally formed by, for example, die molding or cutting. The base body 20 may be a conductor such as a metal sheet as long as insulation of the inner terminals 5 and the outer terminals 7 is ensured. The base body 20, however, is typically formed of an insulator. Although the base body 20 may be a flexible substrate such as a polyimide substrate, the base body 20 is desirably a rigid substrate, such as a glass epoxy substrate, a composite substrate, a glass composite substrate, a Bakelite substrate, or a ceramic substrate. In particular, the ceramic substrate is desirable, and the ceramic substrate of the base body 20 is desirably a laminated ceramic. The ceramic material may be silicon carbide, aluminum nitride, sapphire, alumina, silicon nitride, cermet, yttria, mullite, forsterite, cordierite, zirconia, or steatite.

As shown in FIGS. 2A, 2B, 3A, and 3B, the peripheral region of the base body 20 having the concave shape includes a stage part and a step part. The stage part is a part that extends in the X direction and Y direction. The step part is located between two stage parts at different heights in the Z direction, and extends in the Z direction.

The stage part provided with the inner terminals 5 is determined as a fiducial stage part 202. In this embodiment, as shown in FIGS. 2A and 3A, an upper stage part 204 is located at the side of the outer edge of the package 50 with respect to the inner terminal groups in the Y direction, that is, at the side of the outer edge 205 of the base body 20. The upper stage part 204 protrudes (projects) with respect to the fiducial stage part 202. That is, the upper stage part 204 is located at the side of the lid body 30 with respect to the fiducial stage part 202 in the Z direction. A step part 203 is located between the fiducial stage part 202 and the upper stage part 204. The step part 203 faces the connection conductors 4 through part of the inner space 60.

Also, in the example shown in FIGS. 2A and 2B, the base body 20 includes a lower stage part 200 in addition to the fiducial stage part 202 and the upper stage part 204. The lower stage part 200 is located at a position farther from the outer edge 205 of the base body 20 than the position of the inner terminal groups. That is, the lower stage part 200 is located at the inner side of the base body 20 than the positions of the inner terminal groups. The lower stage part 200 is recessed with respect to the fiducial stage part 202 through a step part 201. That is, the lower stage part 200 is located at a position farther from the lid body 30 than the positions of the inner terminal groups through the step part 201 in the Z direction. The step part 201 faces the outer edge 105 of the electronic device 10 through part of the inner space 60. The fiducial stage part 202 is located between the upper stage part 204 and the lower stage part 200. Hence, the fiducial stage part 202 may be called middle stage part. As shown in FIG. 2B, the fiducial stage part 202 is not provided between the lower stage part 200 and the upper stage part 204 in the X direction along which the inner terminals 5 are not provided. The step part 203 is located between the upper stage part 204 and the lower stage part 200. A middle stage part may be provided between the upper stage part 204 and the lower stage part 200 in the X direction like the middle stage part provided in the Y direction. However, such a middle stage part not provided with the inner terminals 5 may result in a needless increase in size of the package 50. Desirably, such a middle stage part is not provided.

Next, a modification of the electronic component 100 is described with reference to FIGS. 3A and 3B. FIGS. 3A and 3B are sectional views taken along lines similar to those of FIGS. 2A and 2B. In the modification shown in FIGS. 3A and 3B, the electronic device 10 is fixed to the fiducial stage part 202 arranged with the inner terminals 5, and the lower stage part 200 as shown in FIGS. 2A and 2B is not provided. In the example shown in FIG. 2A, the base body 20 has a three-stage structure. In contrast, in the example in FIG. 3A, the base body 20 has a two-stage structure. The upper stage part 204 protrudes from the fiducial stage part 202 through the step part 203. This point is similar to the example in FIG. 3A. The base body 20 in FIGS. 3A and 3B includes the upper stage part to which the frame body 40 is bonded, and the lower stage part to which the electronic device 10 is bonded. The lower stage part may be assumed as the fiducial stage part 202 provided with the inner terminals 5.

The lid body 30 that faces the electronic device 10 has a function of protecting the electronic device 10. If the electronic device 10 is an image pickup device or a display device that uses light, the lid body 30 is required to be transparent to the light (typically, visible light). A suitable material for such a lid body 30 is, for example, plastic, glass, or quartz crystal. A surface of the lid body 30 may have antireflection coating or infrared cut coating.

Figure 4:
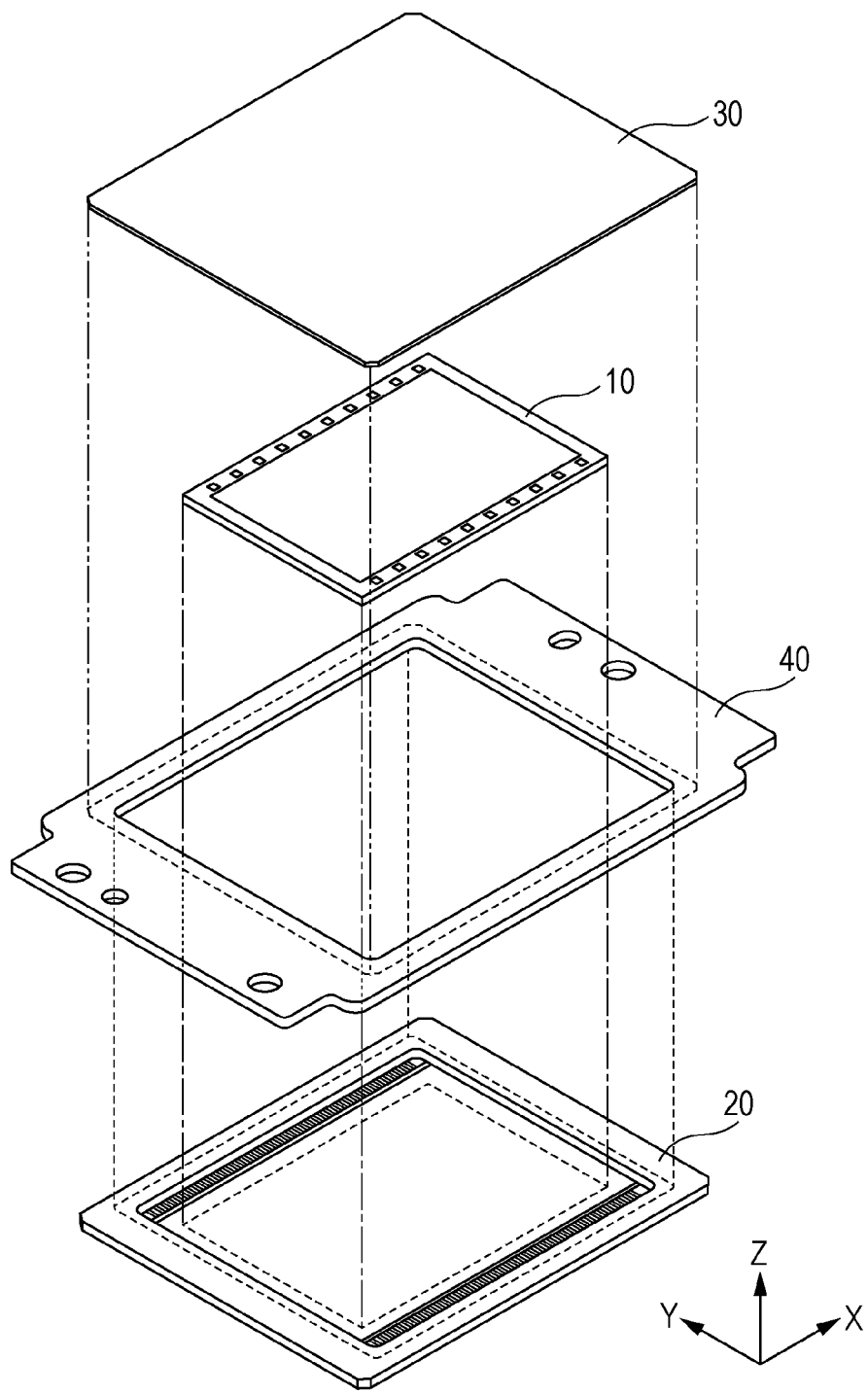
FIG. 4 is an exploded perspective view of the example of the electronic component.

FIG. 4 is an exploded view of the electronic component 100. As it is understood from FIG. 4, the electronic component 100 is formed by stacking the prepared electronic device 10, base body 20, lid body 30, and frame body 40 in the Z direction. In FIG. 4, long broken lines indicate the relationship between the base body 20 and the frame body 40, single-dot chain lines indicate the relationship between the electronic device 10 and the base body 20, and double-dot chain lines indicate the relationship between the frame body 40 and the lid body 30. Also, broken lines indicate the outline of the lid body 30 on the frame body 40, the outline of the electronic device 10 on the base body 20, and the outline of the frame body 40 on the base body 20.

The lid body 30 is fixed to the base body 20 through the frame body 40. More specifically, as shown in FIGS. 2A and 2B, the frame body 40 and the base body 20 are bonded to each other in the peripheral region enclosing the center region of the base body 20 through a jointing material 51. Also, as shown in FIGS. 2A and 2B, the frame body 40 and the lid body 30 are bonded to each other in a peripheral region enclosing a center region of the lid body 30 through a jointing material 53. The electronic device 10 and the inner space 60 are located between the center region of the base body 20 and the center region of the lid body 30. In this embodiment, the lid body 30 is located at the position farther from the electronic device 10 and the base body 20 than the position of the frame body 40 in the Z direction, and the jointing material 53 is provided on the inner surface 302 of the lid body 30, the inner surface 302 being a facing surface of the lid body 30 facing the electronic device 10. Alternatively, like a form in FIG. 3 of Japanese Patent Laid-Open No. 2003-101042, part of the frame body 40 may be located at a position farther from the electronic device 10 and the base body 20 than the position of the lid body 30 in the Z direction, and the jointing material 53 may be provided on the outer surface 301 of the lid body 30.

More specifically, the frame body 40 and the base body 20 are bonded with use of an adhesive, the electronic device 10 and the base body 20 are bonded with use of an adhesive, and the lid body 30 and the frame body 40 are bonded with use of an adhesive. The order of bonding these parts is not particularly limited. However, it is desirable that the frame body 40 and the base body 20 are bonded before the lid body 30 and the frame body 40 are bonded. Also, it is desirable that the frame body 40 and the base body 20 are bonded before the electronic device 10 and the base body 20 are bonded. That is, the frame body 40 and the base body 20 are bonded first, and hence the mounting member having an arrangement region for disposing an electronic device 10 thereon is formed. The electronic device 10 is fixed to the mounting member on the arrangement region. Then, the lid body 30 is bonded to the mounting member.

The base body 20 and the frame body 40 are bonded by the jointing material 51 desirably at the entire circumferences of their joint surfaces. Also, the lid body 30 and the frame body 40 are bonded by the jointing material 53 desirably at the entire circumferences of their joint surfaces. As described above, the entire circumferences of the peripheral regions of the base body 20 and the lid body 30 serve as bonding regions, so that the inner space 60 around the electronic device 10 becomes hermetically sealed from the outside air. Accordingly, a foreign substance is prevented from entering the inner space 60, and reliability is increased. To ensure hermeticity, the adhesive may be used by a sufficient amount. For example, the jointing materials 51, 52, and 53 have thicknesses in a range from 1 to 1000 μm, and typically in a range from 10 to 100 μm.

The above-described jointing materials 51, 52, and 53 are formed by solidifying the applied adhesives. The type of adhesive may be, for example, drying solidification type through evaporation of a solvent, chemical reaction type by hardening through polymerization of molecules with light or heat, or thermal fusion (hot-melt) type by solidifying through setting of a molten adhesive. A typical adhesive may be a photo-curable resin that is hardened with an ultraviolet ray or visible light, or a thermosetting resin that is hardened with heat. The thermosetting resin is suitably used for the adhesives of the jointing material 51 and the jointing material 52. The photo-curable resin is suitably used for the adhesive of the jointing material 53. In the case of the thermosetting resin, the color of the adhesive and the jointing material is not particularly limited, and may be white, black, transparent, etc. In the case of the photo-curable resin, the color of the adhesive and the jointing material is transparent to visible light and/or ultraviolet light. The adhesive and the jointing material may properly contain an inorganic or organic filler. If the filler is contained, moisture resistance can be increased. Elastic modulus of the jointing material after the adhesive is hardened is not particularly limited. However, if the adhesive bonds different materials together, the adhesive is desirably relatively soft resin (resin with low elastic modulus). For example, the elastic modulus is desirably in a range from 1 MPa to 100 GPa, although it is not limited thereto.

The frame body 40 includes a joint surface 401 that faces the base body 20 and is bonded to the jointing material 51, and a joint surface 402 that faces the lid body 30 and is bonded to the jointing material 53. The frame body 40 is provided to enclose the inner space 60 between the electronic device 10 and the lid body 30. A surface of the frame body 40, the surface which faces the inner space 60 and encloses the inner space 60, is the inner edge 403. The outer edge 405 of the frame body 40 is exposed to the outer space. The frame body 40 in this example has an extension part 404 that extends in the X direction from between the base body 20 and the lid body 30 to the outer space. The extension part 404 has a through hole 406. The through hole 406 is used for a screwing hole for fixture to a housing or the like of an electronic apparatus, or is used for a positioning hole. If the electronic device 10 is an image pickup device, the electronic apparatus includes an image pickup apparatus, such as a still camera or a video camera, and an information terminal having an image capturing function.

To enhance the hermeticity of the inner space 60, the frame body 40 desirably continuously encloses the inner space 60 without a break. Also, to ensure the rigidity of the frame body 40 and further the rigidity of the electronic component 100, the frame body 40 is desirably a closed loop without a break. Also, to ensure thermal conductance (described later), the frame body 40 is desirably a closed loop that is continuous in the circumferential direction. However, if limitation is provided in manufacturing, the frame body 40 may be divided into a plurality of sections on a side basis and may be arranged. Alternatively, the frame body 40 may have slits to allow the inner space 60 to communicate with the outer space. If the frame body 40 has breaks in this way, discontinuous portions (slits) generated in the frame body 40 are desirably as few as possible. More specifically, the total length of the discontinuous portions is desirably less than 10% of the length of the circumference that encloses the inner space 60 and the electronic device 10. In other words, if the frame body 40 is present by a length in total that is 90% or more of the length of the circumference along the circumference of the inner space 60 and the electronic device 10, it can be assumed that the frame body 40 encloses the inner space 60 and the electronic device 10.

The material of the frame body 40 may properly use resin, ceramic, or metal. The metal mentioned here includes not only a metal of one kind, but also an alloy of metals. In this embodiment, the frame body 40 and the base body 20 are bonded by using the adhesive. Hence, this embodiment is suitable when the material of the frame body 40 is different from the material of the base body 20. Also, this embodiment is suitable when the material of the frame body 40 is different from the material of the lid body 30. An example of such a case is when the material of the base body 20 is ceramic, the material of the lid body 30 is glass, and the material of the frame body 40 is metal or resin.

If the frame body 40 has high thermal conductance, heat of the electronic device 10 can be radiated through the extension part 404. For heat radiation, the thermal conductivity of the frame body 40 is preferably 1.0 W/m·K or higher, or more preferably 10 W/m·K or higher. A thermal conductivity of resin is typically lower than 1.0 W/m·K.

Also, to reduce a stress that is generated on the electronic component 100, the frame body 40 desirably has a thermal expansion coefficient (linear expansion coefficient) being as low as possible. More specifically, the thermal expansion coefficient of the frame body 40 is desirably 50 ppm/K or smaller. A thermal expansion coefficient of resin is typically larger than 50 ppm/K.

In the viewpoint of the thermal conduction and thermal expansion, the material of the frame body 40 is desirably metal or ceramic. Ceramic can have a thermal property equivalent to that of metal; however, ceramic is a brittle material. Hence, in the viewpoint of processability and mechanical strength, metal is more suitable than ceramic. A typical metal material may be aluminum, an aluminum alloy, copper, a copper alloy, iron, an iron alloy, etc. These materials have high processability, and are relatively inexpensive. Also, if the electronic device 10 is an image pickup device, with regard to outdoor use, aluminum, an aluminum alloy, or an iron alloy having a high corrosion resistance is suitable. Further, the material of the frame body 40 is desirably an iron alloy, such as stainless steel, or other iron alloy containing chromium, nickel, or cobalt. For example, such a material may be SUS430 that is a ferritic stainless steel, SUS304 that is an austenitic stainless steel, 42 alloy, Kovar, etc.

The frame body 40 has a function of determining a gap between the electronic device 10 and the lid body 30, and a function of supporting the lid body 30. Also, the frame body 40 has the above-described screwing hole or positioning hole and has a function such as a heat radiating member since the frame body 40 has high thermal conductance. Hence, the base body 20 and the frame body 40 may be collectively called mounting member. An example of a manufacturing method relating to the electronic component 100 is described. FIGS. 5A to 7J are schematic sectional views taken along line A-a in FIGS. 1A and 1B.

Figure 5A:
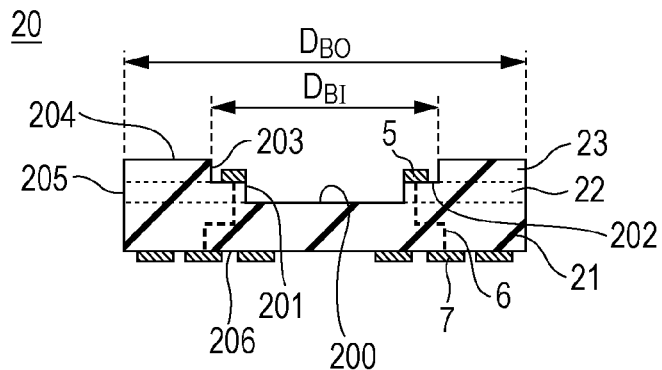
FIGS. 5A to 5C are schematic sectional views of an example of a manufacturing method of the electronic component (a mounting member).

FIG. 5A shows a step a of preparing the base body 20. As described above, the base body 20 equips the inner terminals 5, the embedded part 6, and the outer terminals 7. Also, the base body 20 has the step part 203 that connects the fiducial stage part 202 and the upper stage part 204, and also has the step part 201 that connects the fiducial stage part 202 and the lower stage part 200. The inner terminals 5 are provided on the fiducial stage part 202. The outer terminals 7 are provided on the back surface 206 of the base body 20.

Such a base body 20 is formed of a laminated ceramic that is formed, for example, as follows. First, a green sheet that is formed by a sheet forming method, such as a doctor blade method or a calender roller method, is punched with a plate die; a plurality of such punched green sheets are stacked; and hence a plate member of green ceramic is formed. Also, a green sheet, which is similarly formed, is punched with a frame die; a plurality of punched green sheets are stacked; and hence a frame member of green ceramic is formed. The plate member and the frame member are stacked and fired; and hence a laminated ceramic with a concave shape is fabricated. The laminated ceramic may be used as the base body 20. The inner terminals 5, the embedded part 6, and the outer terminals 7 may be formed by firing electrically conductive paste patterns that are formed by a screen printing method etc. during the step of stacking the green sheets.

In this case, a first layer 21 that is a green ceramic plate member, a second layer 22 that is a green ceramic frame member with a small inner diameter, and a third layer 23 that is a green ceramic frame member with a large inner diameter before firing are shown. Since a frame die of the second layer 22 and a frame die of the third layer 23 have different inner diameters, the fiducial stage part 202 can be easily formed. If the base body 20 has the two-stage structure as shown in FIGS. 3A and 3B, the base body 20 may not be formed of the two kinds (the two layers) of the frame members but may be formed of one kind of the frame member in the example shown in FIGS. 3A and 3B. Accordingly, since the frame die for punching may be one kind, the cost can be decreased. An inner diameter $D_{BI}$ and an outer diameter $D_{BO}$ of the step part 203 of the base body 20 are properly determined in accordance with the size of the electronic device to be mounted.

Figure 5B:
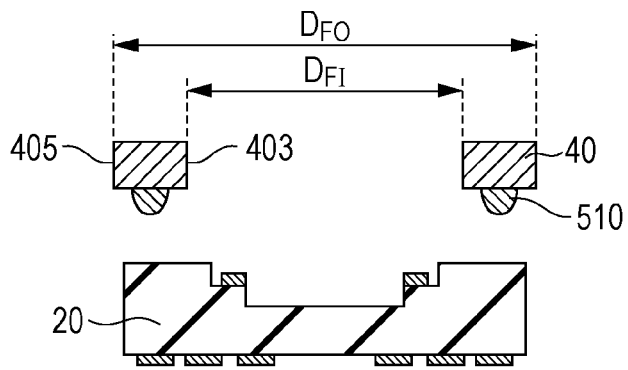

FIG. 5B shows a former sub-step b included in a step of bonding the base body 20 and the frame body 40. The formed frame body 40 is prepared. It is assumed that $D_{FI}$ is an inner diameter of the frame body 40, and $D_{FO}$ is an outer diameter of the frame body 40. Herein, the relationship between the sizes of the base body 20 and the frame body 40 is $D_{BI}<D_{FI}$. Also, $D_{BO}<D_{FO}$. The surfaces of the frame body 40 desirably have roughness by sandblasting. An adhesive 510 is applied to at least one of the upper stage part 204 of the base body 20 and the joint surface 401 of the frame body 40. As shown in FIG. 5B, the adhesive 510 is desirably applied to only the joint surface 401 of the frame body 40. If an application surface of a subject to which an adhesive is applied has undulations, the application amount of the adhesive may vary. The frame body 40 is more flat than the base body 20, and hence the application amount of the adhesive 510 can be easily controlled. As described above, the adhesive 510 is typically thermosetting resin. The application of the adhesive 510 may use printing, dispensing, etc.

Figure 5C:
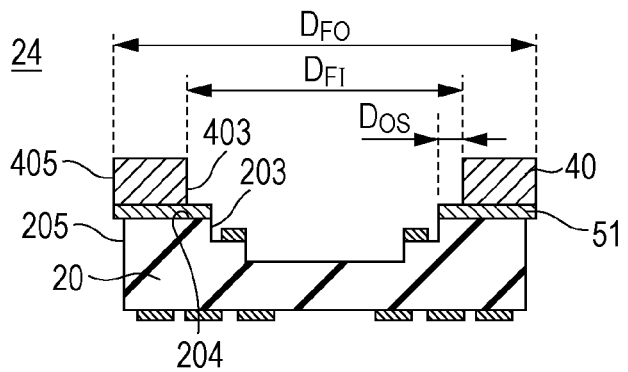

FIG. 5C shows a latter sub-step c included in the step of bonding the base body 20 and the frame body 40. The frame body 40 is mounted on the upper stage part 204 of the base body 20. Herein, the step part 203 of the base body 20 is located at the side of the inner terminals 5 with respect to the inner edge 403 of the frame body 40. An offset amount $D_{OS}$ between the step part 203 and the inner edge 403 at this time depends on the difference between the inner diameter $D_{FI}$ and the inner diameter $D_{BI}$. Typically, $D_{OS}=(D_{FI}-D_{BI})/2$ is established. Of course, the adhesive 510 is liquid at this time. When the frame body 40 is pressed to the base body 20 due to the self-weight of the frame body 40 or a pressure, an excess of the adhesive 510 may protrude from between the frame body 40 and the base body 20.

Then, the applied adhesive 510 is solidified by a proper method. The suitable adhesive 510 is thermosetting resin, and is hardened with heat at temperatures in a range from about 80° C. to 200° C. Accordingly, the liquid adhesive 510 becomes the solid jointing material 51, and the frame body 40 and the base body 20 are bonded through the jointing material 51. In this way, a mounting member 24 including the frame body 40 and the base body 20, and having the arrangement region on which an electronic device is to be disposed, can be manufactured.

Figure 6D:
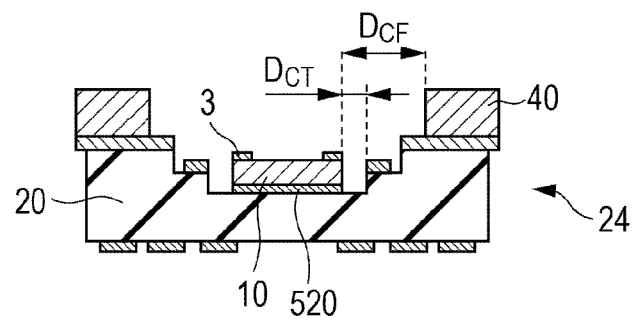
FIGS. 6D to 6G are schematic sectional views of the example of the manufacturing method of the electronic component.

FIG. 6D shows a step d of fixing the electronic device 10 to the base body 20. The electronic device 10 has the electrodes 3. An adhesive 520 such as die bond paste is applied to at least one of the lower stage part 200 of the base body 20 and the back surface 102 of the electronic device 10 (typically, only the lower stage part 200 of the base body 20). Then, the electronic device 10 is arranged on the adhesive 520. Then, as shown in FIG. 6E, the adhesive 520 is solidified, the jointing material 52 is formed, and hence the electronic device 10 and the base body 20 are bonded.

Figure 6E:
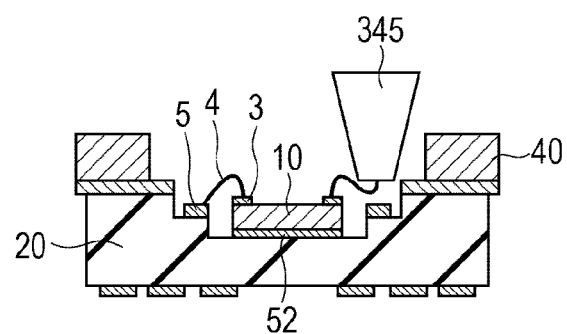

FIG. 6E shows a step e of electrically connecting the electronic device 10 with the base body 20. In this example, wire bonding connection is used. One end of a metal wire fed from a distal end of a capillary 345 is connected with the corresponding electrode 3, and then the other end of the metal wire is connected with the corresponding inner terminal 5. The metal wire forms the connection conductor 4. If flip-chip connection is employed, a bump may serve as the jointing material 52 and the connection conductor 4. Herein, the base body 20 has the configuration in which the electronic device 10 is provided on the lower stage part 200, and the fiducial stage part 202 provided with the inner terminals 5 is located above the lower stage part 200. Owing to this, an area in which the capillary 345 may interfere with the step part 203, the upper stage part 204, and the electronic device 10 can be decreased. Thus, the electronic component 100 can be decreased in size.

Figure 6F:
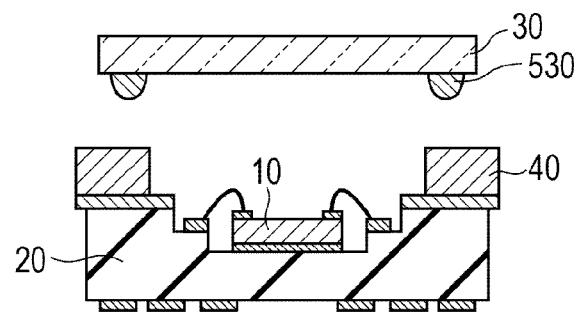

FIG. 6F shows a former sub-step f included in a step of bonding the lid body 30 to the frame body 40. FIG. 6F shows a state after all the inner terminals 5 and all the electrodes 3 are connected through the connection conductors 4. An adhesive 530 is applied to at least one of the joint surface 402 of the frame body 40 and the joint surface (in this example, the inner surface 302) of the lid body 30. As described above, the adhesive 530 is typically photo-curable resin. The application of the adhesive 530 may use printing, dispensing, etc. As shown in FIG. 6F, the adhesive 530 is desirably applied to only the inner surface 302 of the lid body 30. When dispensing is employed, if an application surface of a subject to which an adhesive is applied has undulations, the application amount of the adhesive may vary. The lid body 30 is more flat than the frame body 40, and hence the application amount of the adhesive 530 can be easily controlled.

Figure 6G:
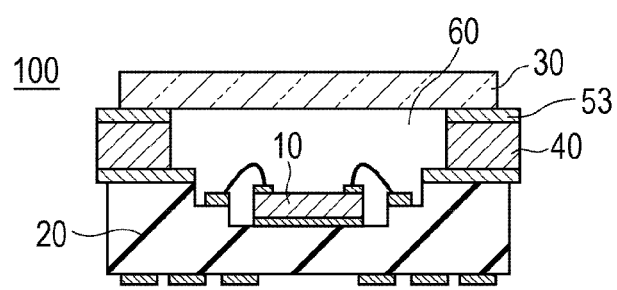

FIG. 6G shows a latter sub-step g included in the step of bonding the lid body 30 to the frame body 40. The lid body 30 is mounted on the frame body 40. Of course, the adhesive 530 is liquid at this time. When the lid body 30 is pressed to the frame body 40 due to the self-weight of the lid body 30 or a pressure, an excess of the adhesive 530 may protrude from between the frame body 40 and the lid body 30.

Then, the applied adhesive 530 is solidified by a proper method. Accordingly, the liquid adhesive 530 becomes the solid jointing material 53, and the frame body 40 and the lid body 30 are bonded through the jointing material 53. Photo-curable resin is used as the adhesive 530 by the following reason. When the adhesive 530 is applied to the entire circumference of the joint surface, if a thermosetting adhesive is used as the adhesive 530, the inner space 60 may be thermally expanded when being heated, and the liquid adhesive 530 may be pushed out due to the internal pressure. If a photo-curable adhesive is used, such a phenomenon does not occur. If the photo-curable adhesive is semi-hardened by photo-curing, auxiliary thermosetting may be used for post-hardening. To properly use the photo-curable adhesive 510, the lid body 30 desirably has sufficient optical transmissivity for wavelengths with which the adhesive 510 reacts, such as an ultraviolet ray. In this way, the electronic component 100 can be manufactured.

Figure 7H:
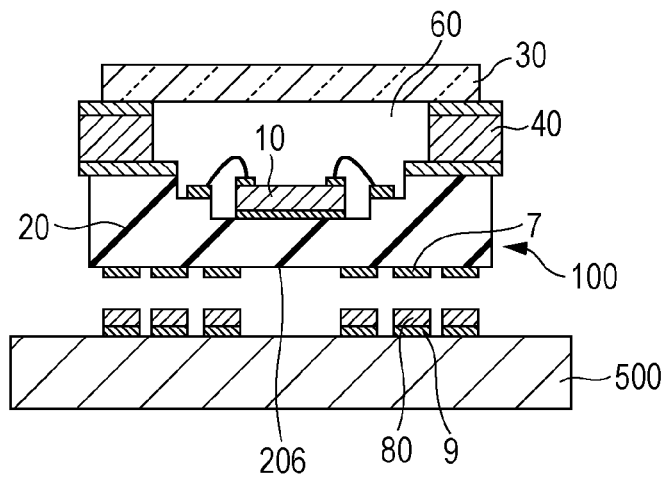
FIGS. 7H to 7J are schematic sectional views of an example of a manufacturing method of an electronic apparatus.

FIG. 7H shows a former sub-step h of a manufacturing method of an electronic module 600. A wiring member 500 for second-mounting the electronic component 100 fabricated as described above is prepared. The wiring member is, for example, a rigid wiring board, a flexible wiring board, or a rigid-flexible wiring board, and is typically a printed wiring board. Solder paste 80 (solder cream) is applied to connection terminals 9 of the wiring member 500 by a known method such as screen printing. Then, the electronic component 100 is mounted on the wiring member 500 such that the back surface 206 of the base body 20 faces the wiring member 500, and the solder paste 80 is interposed between the connection terminals 9 and the outer terminals 7.

Figure 7I:
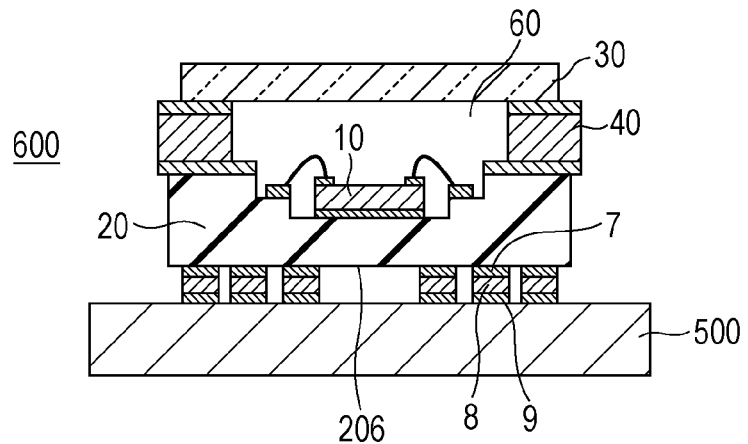

FIG. 7I shows a latter sub-step i of the manufacturing method of the electronic module 600. The electronic component 100 and the wiring member 500 are put into a furnace (reflow oven), the solder paste 80 is molten at temperatures in a range from about 180° C. to 250° C., and solder serving as connection conductors 8 is formed. In this way, the electronic component 100 is fixed to the wiring member 500 by reflow soldering. Thus, the electronic module 600 including the electronic component 100 and the wiring member 500 can be manufactured. It is to be noted that an electronic component other than the electronic component 100, for example, an integrated circuit component, a discrete component, etc., may be mounted on the wiring member 500.

Figure 7J:
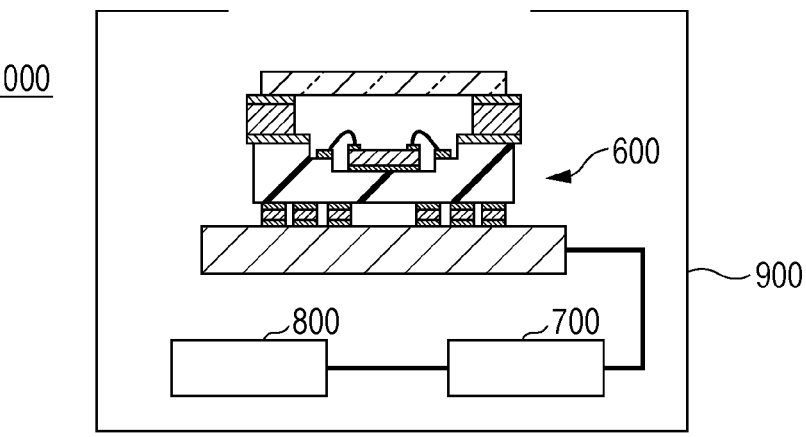

FIG. 7J shows an electronic apparatus 1000. The wiring member 500 of the electronic module 600 is connected with an external circuit 700. The external circuit is, for example, a processor or a memory. The external circuit may be an integrated circuit component. Other electronic component 800 such as a display is connected with the external circuit. These components and circuits are housed in a housing 900, and thus the electronic apparatus 1000 can be manufactured. The extension part 404 for heat radiation provided at the electronic component 100 is thermally connected with the housing 900 or a heat sink that is provided in the housing 900. Accordingly, heat generated at the electronic device 10 is radiated to the outside through the extension part 404.

In this embodiment, the relationship between the base body 20 and the frame body 40 is important. In particular, the relationship between the base body 20 and the frame body 40 is featured by the shape of the base body 20. The detail of the relationship is described with reference to FIG. 8A, which is an enlarged view showing an area near the upper stage part 204 in FIG. 2A or FIG. 3A. The inner edge 403 of the frame body 40 is located at a position farther from the inner terminal groups than the position of the step part 203 in the Y direction. That is, the inner edge 403 is offset toward the side of the outer edge (outer side) of the package 50 from the step part 203. This offset amount is indicated by a distance $D_{OS}$ between the inner edge 403 and the step part 203 in the Y direction. Since the inner edge 403 is offset from the step part 203, the upper stage part 204 has a facing region 214 facing the frame body 40, and a non-facing region 224 not facing the frame body 40. The non-facing region 224 is a region of the upper stage part 204 at the side of the step part 203, and is a region continuously extending from a boundary 234 between the upper stage part 204 and the step part 203. The boundary 234 is located at an end of the upper stage part 204 at the side of the step part 203 in the Y direction, and is located at an end of the step part 203 at the side of the upper stage part 204 in the Z direction. As described above, in the package 50 of this embodiment, the non-facing region 224 is formed at the upper stage part 204 of the base body 20 by using the frame body 40.

Figure 8A:
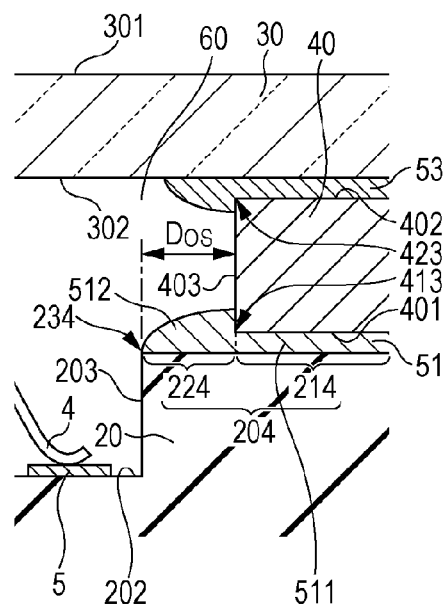
FIGS. 8A to 8D are enlarged schematic sectional views of the example of the electronic component.

A portion of the jointing material 51 located between the base body 20 and the frame body 40, or more specifically, a portion located between the facing region 214 and the joint surface 401 is a jointing portion 511 that substantially contributes to bonding between the frame body 40 and the base body 20. As shown in FIG. 8A, the jointing material 51 typically has a protruding portion 512 in addition to the jointing portion 511. The protruding portion 512 is located on the non-facing region 224.

This non-facing region 224 can prevent the jointing material 51 from contacting the inner terminals 5, the connection conductors 4, or the electronic device 10. Also, the jointing material 53 can be prevented from contacting the inner terminals 5. The offset amount may be desirably larger than the thickness of the jointing portion of the jointing material 51, the jointing portion being located between the frame body 40 and the base body 20 and substantially contributing to bonding. The thickness of the jointing material 51 is typically smaller than 100 µm. Hence, the offset amount (the distance $D_{OS}$) is desirably 100 µm or larger. Further, the offset amount (the distance $D_{OS}$) is desirably larger than the height of the step part 203. The strength of bonding depends on the width of the jointing material 51. The width of the jointing material 51 is desirably larger than the thickness of the jointing material 51. The width of the jointing material 51 is desirably at least ten times the thickness of the jointing material 51. For example, the width of the jointing material 51 is in a range from 100 to 10000 µm, or is typically in a range from 500 to 5000 µm.

Figure 8B:
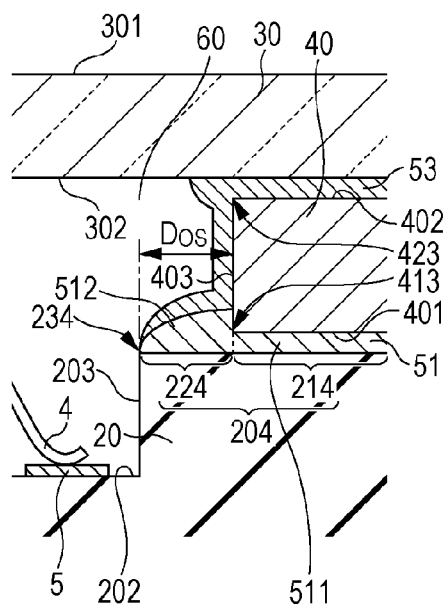
Figure 8C:
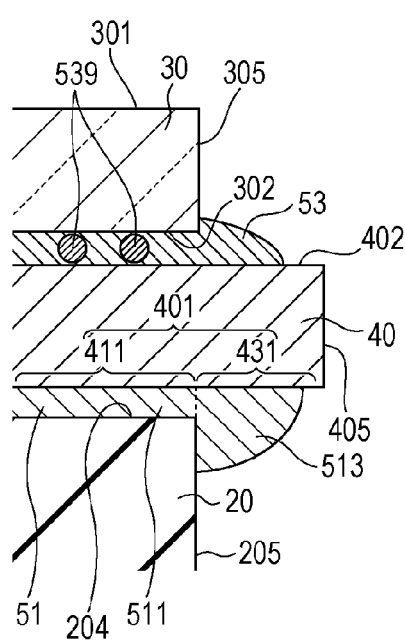

Also, in this embodiment, the outer edge 405 of the frame body 40 is located at a position farther from the inner space 60 than the position of the outer edge 205 of the base body 20. That is, the outer edge 405 protrudes with respect to the outer edge 205. FIG. 8C is an enlarged view of an area around the outer edge 405 of the frame body 40. The jointing material 51 may have a protruding portion 513 in addition to the jointing portion 511. The joint surface 401 of the frame body 40 has a facing region 411 facing the base body 20, and a non-facing region 431. In this example, the entire circumference of the outer edge 405 of the frame body 40 is located at the outer side with respect to the outer edge 205 of the base body 20. That is, in addition to the X direction in which the extension part 404 is provided, in the Y direction, the outer edge 405 of the frame body 40 protrudes from a part corresponding to the outer edge 205 of the base body 20. Also, the protruding portion 513 of the jointing material 51 is located below the non-facing region 431 of the joint surface 401. This protruding portion 513 may or may not contact the outer edge 205.

The non-facing region 224 is described. As described above, when the frame body 40 and the base body 20 are bonded by using the adhesive 510, the adhesive 510 protrudes. This protruding portion may occasionally decrease the reliability of the electronic component 100. This is when the protruding adhesive 510 adheres to the inner terminals 5.

A metal material such as nickel is exposed from the joint surfaces of the inner terminals 5 and the connection conductors 4. Owing to this, if resin adheres to the joint surfaces, since resin likely keeps moisture, the metal material may be likely corroded. Also, of course, if the insulating adhesive 510 adheres to the inner terminals 5 before the connection conductors 4 are connected, the connection conductors 4 and the inner terminals 5 may not be connected, or connection resistance may be increased. Also, even if the electronic device 10 is fixed and the connection conductors 4 are connected before bonding of the frame body 40, a similar problem may occur. This is a case in which air bubbles are generated in the adhesive 510 adhering to an area near the connection portion between the metal wires that are connection conductors 4 and the inner terminals 5. The air bubbles may be expanded/contracted in accordance with a change in temperature during manufacturing or during use, and hence the air bubbles may damage the metal wires and the connection portion. In particular, a resin material likely absorbs moisture. The influence of evaporation of moisture kept in the air bubbles and expansion/contraction of water vapor is large.

In this embodiment, the upper stage part 204 has the non-facing region 224 that does not face the frame body 40. The protruding adhesive 510 is held on the non-facing region 224. The excessive protruding adhesive 510 is held at the formed non-facing region 224 and by the surface tension at the boundary 234, and the adhesive 510 is prevented from adhering to the inner terminals 5. As described above with reference to FIG. 5B, the adhesive 510 may be applied to the base body 20. However, if the adhesive 510 is applied to the base body 20, the adhesive 510 may be applied to the region, which should be the non-facing region 224, before the frame body 40 is arranged; or the adhesive 510 may not be applied to the region, which should be the facing region 214. To avoid such a situation, the adhesive 510 is desirably applied to the frame body 40 instead of the base body 20. FIG. 8A shows a state of the jointing material 51 that is the adhesive 510 solidified while being held on the non-facing region 224. In the example in FIG. 8A, the jointing material 51 contacts the inner edge 403 of the frame body 40. However, the adhesive 510 may be stopped at a lower end 413 of the inner edge 403 and the jointing material 51 may not contact the inner edge 403. Also, the adhesive 520 may be stopped at an upper end 423 of the inner edge 403 and the jointing material 52 may not contact the inner edge 403.

In contrast, if the offset amount is zero or minus, it can be easily expected that the adhesive 510 protruding from between the frame body 40 and the base body 20 drips along the step part 203. The case in which the offset amount is minus is when the step part 203 is located at the side of the outer edge 205 with respect to the inner edge 403.

Further, in this embodiment, the protrusion of the protruding adhesive 510 is likely stopped at the boundary 234 between the upper stage part 204 and the step part 203. This may be because of the surface tension action at the boundary 234. To increase the surface tension action at the boundary 234, the angle formed by the upper stage part 204 and the step part 203 is desirably an acute angle or a right angle. If the laminated ceramic is used for the base body 20, the angle at the boundary 204 can be close to a right angle, and a curvature can be increased. Even if the step part 203 is an inclined surface so that the upper stage part 204 and the step part 203 form an obtuse angle, as compared with that the upper stage part 204 and the step part 203 are arranged in the same plane, a certain effect is expected because the creepage distance from the jointing material 51 to the inner terminals 5 can be increased. However, the surface tension action at the boundary 234 is decreased. The angle formed by the upper stage part 204 and the step part 203 is desirably 120° or larger.

Further, if the adhesive 510 protrudes beyond the boundary 234, the adhesive can be held at the step part 203 by an amount corresponding to the height of the step part 203. In contrast, if the step part 203 is not provided, to hold the adhesive by the amount corresponding to the height of the step part 203, the joint surfaces of the frame body 40 and the base body 20 have to be located at a farther position from the inner terminals 5 toward the side of the outer edge 205 by a distance equivalent to the height of the step part 203 in the Y direction. In this embodiment, since the step part 203 extending along the Z direction is provided, an increase in size of the electronic component 100 in the Y direction can be restricted.

Also, the non-facing region 224 is effective even if the adhesive 530 provided between the lid body 30 and the frame body 40 protrudes. As shown in FIG. 8B, even if the adhesive 530 drips along the inner edge 403 of the frame body 40, the adhesive 530 can be held at an area directly above the non-facing region 224 or on the jointing material 51 on the non-facing region 224. Owing to this, similarly to the adhesive 510, the adhesive 530 can be prevented from adhering to the inner terminals 5 and the connection conductors 4. To prevent liquid dripping of the adhesive 530, the advantage provided by the boundary 234 and the step part 203 is similar to that of the adhesive 510.

FIG. 8C is an enlarged view of an area around the outer edge 405 of the frame body 40. Since the frame body 40 has the non-facing region 431, the protruding portion 513 is held at the non-facing region 431 by the surface tension action. Owing to this, the adhesive 510 can be prevented from dripping along the outer edge 205. Also, since the outer edge 405 of the frame body 40 is larger than the outer edge 205 of the base body 20, the following advantage is provided. For example, when the electronic component 100 is viewed in plan view for inspection, the protruding portion 513 is hidden by the non-facing region 431. Accordingly, the protruding portion 513 can be prevented from being incorrectly recognized as the outline of the electronic component 100. Also, when the electronic component 100 is housed in a transport container, even if the electronic component 100 is moved and the electronic component 100 rubs against the container, a phenomenon in which the protruding portion 513 made of resin rubs against the container and generates particles can be prevented.

Spacers 539 are provided in the jointing material 53 between the frame body 40 and the lid body 30. The spacers 539 are typically spherical particles, are located between the frame body 40 and the lid body 30, and contact both the frame body 40 and the lid body 30. That is, the spherical particles are interposed between the frame body 40 and the lid body 30. Since the spacers 539 are provided, the spacers 539 can properly control the thickness of the jointing material 53 and the protrusion of the adhesive 530. The spacers may be also arranged between the frame body 40 and the base body 20.

Figure 8D:
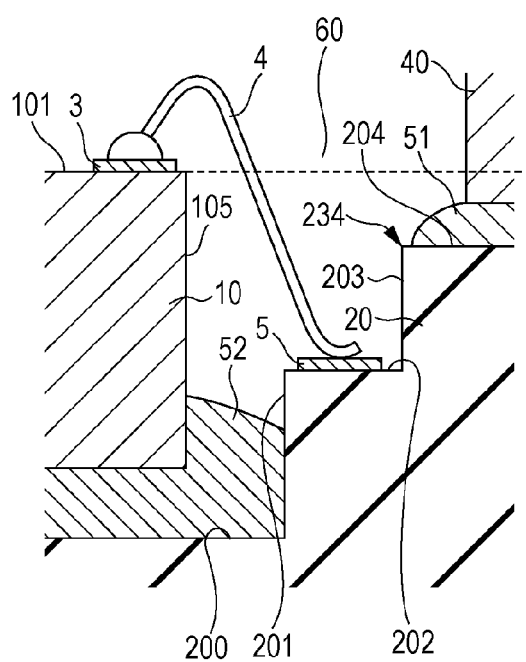

FIG. 8D is an enlarged view of an area around the step part 201 in FIG. 2A. The lower stage part 200, which is different from the fiducial stage part 202, is provided at the base body 20, and the electronic device 10 is bonded to the lower stage part 200. Accordingly, the electronic component 100 can be decreased in size. As shown in FIG. 3A, when the electronic device 10 is bonded to the fiducial stage part 202, to avoid the jointing material 52, which protrudes from between the arrangement region 210 and the electronic device 10, from contacting the inner terminals 5, the electronic device 10 has to be sufficiently separated from the inner terminals 5. Regarding this point, in the example described with reference to FIG. 2A, the inner terminals 5 are separated from the adhesive 520 in the Z direction as shown in FIG. 8D. With this arrangement, the protruding jointing material 52 is stopped at the step part 201. Owing to this, even though the distance between the inner terminals 5 and the electronic device 10 is not large in the Y direction, the jointing material 52 is prevented from contacting the inner terminals 5 located at the fiducial stage part 202 corresponding to the upper stage of the lower stage part 200. Hence, even though the distance between the outer edge 105 of the electronic device 10 and the inner terminals 5 is decreased for a decrease in size of the electronic component 100, the reliability can be prevented from being decreased. Rather, since the distance between the electrodes 3 and the inner terminals 5 can be decreased, an increase in reliability is expected. Also, as indicated by a dotted line in FIG. 8D, the upper stage part 204 may be located at a position farther from the lid body 30 than the position of the front surface 101 being a facing surface of the electronic device 10 facing the lid body 30. That is, the distance between the electronic device 10 and the lid body 30 is larger than the distance between the upper stage part 204 and the lid body 30, and the upper stage part 204 encloses the electronic device 10. At this time, the joint surface 401 of the frame body 40 is typically provided to enclose the electronic device 10. In contrast, the joint surface 402 of the frame body 40 is located above the front surface 101 of the electronic device 10, the joint surface 402 does not finally enclose the electronic device 10, but encloses the inner space 60. As described above, the frame body 40 is desirably provided to enclose the inner space 60 and the electronic device 10.

EXAMPLES

Hereinafter, examples of the present invention are described. The electronic component 100 of the first example shown in FIGS. 2A and 2B and the electronic component 100 of the second example shown in FIGS. 3A and 3B were fabricated. An electronic component 100 of a comparative example was also fabricated. Any of the electronic components 100 have a rectangular plate shape with the X direction being the long-side direction and the Y direction being the short-side direction.

For the electronic component 100 of the first example, the rectangular concave base body 20, in which three alumina ceramic layers with different shapes were stacked, was prepared. In the base body 20, the thickness of the plate-shaped first layer 21 is 0.8 mm, the thickness of the frame-shaped second layer 22 (the height of the step part 201) is 0.4 mm, and the thickness of the frame-shaped third layer 23 (the height of the step part 203) is 0.2 mm. The outer diameter of the first layer 21 in the X direction is 32.0 mm. The outer diameter of the first layer 21 in the Y direction is 26.4 mm. The outer diameter of the second layer 22 in the X direction is 32.0 mm, and the inner diameter thereof is 26.2 mm (the frame width thereof is 2.9 mm). The outer diameter of the second layer 22 in the Y direction is 26.4 mm, and the inner diameter thereof is 19.6 mm (the frame width thereof is 3.4 mm). The outer diameter of the third layer 23 in the X direction is 32.0 mm, and the inner diameter thereof is 26.2 mm (the frame width thereof is 2.9 mm). The outer diameter (corresponding to $D_{BO}$) of the third layer 23 in the Y direction is 26.4 mm, and the inner diameter (corresponding to $D_{BI}$) thereof is 21.4 mm (the frame width thereof is 2.5 mm). The width in the Y direction of the fiducial stage part 202 provided with the inner terminals 5 is 0.9 mm.

In the electronic component 100 of the second example, the rectangular concave base body 20, in which two alumina ceramic layers were stacked, was prepared. In the base body 20, the thickness of the plate-shaped first layer 21 is 0.8 mm, and the thickness of the frame-shaped second layer 22 is 0.6 mm. The outer and inner diameters of the second layer 22 in the X direction and the Y direction are respectively equivalent to those of the third layer 23 of the first example.

In the electronic component 100 of the comparative example, the rectangular flat-plate-shaped base body 20 made of alumina ceramic was prepared. In the base body 20, the thickness of the plate-shaped first layer 21 is 0.8 mm. The outer diameters of the first layer 21 in the X direction and the Y direction are respectively equivalent to those of the first layer 21 of the first example.

The inner terminals 5 and the outer terminals 7 each use a laminate film of nickel and gold. The outer terminals 7 are LGA type, and 125 outer terminals 7 are provided.

Next, the frame body 40 made of SUS430 (18% chromium stainless steel) being a ferritic stainless steel was prepared, and thermosetting resin was applied as the adhesive 510 on one surface of the frame body 40 by screen printing. Then, the frame body 40 was mounted on the upper stage part 204 of the base body 20, and a pressure was applied. The pressure was adjusted so that the thickness of the thermosetting resin was in a range from 10 to 50 μm. At this time, it was found that the adhesive 510 protruded from between the frame body 40 and the base body 20. Then, heat at temperatures in a range from about 120° C. to 150° C. was applied, and thus the thermosetting resin as the adhesive 510 was hardened. To increase an adhesive force to the thermosetting resin, the surfaces of the frame body 40 were processed by sandblasting to obtain a surface roughness Ra in a range from about 0.1 to 0.2 μm, and thus roughness was applied to the front surface. The thickness of the frame body 40 is 0.8 mm, the outer diameter in the X direction thereof is 42.0 mm (in the outer diameter, the widths of the extension parts 404 provided at the left side and right side are each 4.5 mm), and the inner diameter thereof is 27.4 mm. The outer diameter of the frame body 40 in the Y direction is 27.4 mm, and the inner diameter thereof is 22.6 mm. At this time, the offset distance between the inner edge 403 of the frame body 40 and the step part 203 of the base body 20 was 0.60 mm at each of the left side and right side in the X direction, and 0.60 mm at each of the upper side and lower side in the Y direction. Since the inner edge 403 is larger than the step part 203, the entire circumference of the inner edge 403 is located at the outer side of the step part 203 (at the side of the outer edge 205). Also, the frame body 40 protrudes with respect to the outer edge 205 of the base body 20 by 0.50 mm at minimum and 5.0 mm at maximum (corresponding to the extension part 404) at each of the left side and right side in the X direction, and protrudes by 0.50 mm at each of the upper side and lower side in the Y direction. Since the outer edge 405 is larger than the outer edge 205, the entire circumference of the outer edge 405 is located at the outer side of the outer edge 205 (at the side of the outer edge 205).

Next, a CMOS image sensor with so-called advanced photo system type-C (APS-C) size was prepared as the electronic device 10. This electronic device 10 was fixed by thermosetting substantially at the center of the base body 20, by using the adhesive 520, which was a black die bonding adhesive. Then, the electrodes 3 and the inner terminals 5 provided at the peripheral region of the chip were electrically connected by metal wires with use of a wire bonding apparatus. The distance between the outer edge 105 of the electronic device 10 and the inner edge 403 of the frame body 40 is 1.5 mm in the X direction, and 2.3 mm (corresponding to $D_{CF}$) in the Y direction. Also, the distance between the electronic device 10 and the step part 203 is 0.9 mm in the X direction, and 1.7 mm in the Y direction. A distance $D_{CT}$ between the inner terminals 5 and the outer edge 105 of the electronic device 10 was 0.8 mm in any of the first example, second example, and comparative example.

Next, an α-ray proofed plate member with a thickness of 0.5 mm was prepared as the lid body 30. The dimension in the X direction of the lid body 30 is 31.8 mm and the dimension in the Y direction thereof is 26.3 mm. The dimensions substantially correspond to the outer diameter of the base body 20. Ultraviolet-curable resin was applied as the adhesive 530 in a frame shape on one surface of the lid body 30 by a dispenser, the lid body 30 was mounted on the frame body 40 such that the surface applied with the adhesive 530 faces the joint surface 402 of the frame body 40, and a proper pressure was applied. At this time, the spherical particles each having a diameter of 30 μm were mixed in the adhesive 530, and the thickness of the adhesive 530 was about 30 μm. At this time, it was found that the adhesive 530 protruded from between the lid body 30 and the frame body 40. Then, ultraviolet rays were emitted through the lid body 30 and hence photo-curing processing was performed. Further, as post-hardening, thermosetting processing was performed to harden the adhesive 530, and thus the jointing material 53 was formed. The distance between the front surface 101 of the electronic device 10 and the inner surface 302 of the lid body 30 was 0.75 mm. In this way, the electronic component 100 with a thickness of 2.8 mm was obtained.

With the electronic component 100 of any of the first and second examples, adhesion of any jointing material of the jointing material 51, jointing material 52, and jointing material 53 could not be found. In contrast, with the electronic component 100 of the comparative example, it was found that one of the jointing material 51, jointing material 52, and jointing material 53 contacts the inner terminals 5 or the connection conductors 4. Also, in addition to the above-described visual inspection, a pull strength inspection for checking connection strength was performed for the metal wires serving as the connection conductors 4.

Further, for each of the electronic components 100 of the first and second examples, a configuration with an inner diameter $D_{FI}$ of the frame body 40 being different from that of the above-described inner diameter was prepared, and $D_{OS}$ was changed in a range from 0.1 to 0.9 mm. Consequently, good results were obtained in the visual inspection and pull-strength inspection. This represents that, for example, by changing $D_{OS}$ from 0.6 mm to 0.3 mm, the total dimension of the electronic component 100 can be further decreased by 0.3 mm.

Also, for each of the electronic components 100 of the first and second examples, a configuration with an outer diameter of the electronic device 10 being different from the above-described outer diameter was prepared, and $D_{CT}$ was changed to 0.50 mm. Consequently, good results were obtained in the visual inspection and pull-strength inspection for the electronic component 100 of the first example. However, in the case of the electronic component 100 of the second example, an unacceptable component was occasionally found in the pull-strength inspection. This represents that, for the electronic component 100 of the first example, the total dimension of the electronic component can be further decreased by 0.30 mm as compared with the electronic component 100 of the second example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-103829 filed Apr. 27, 2012 and No. 2013-039450 filed Feb. 28, 2013, which are hereby incorporated by reference herein in their entirety.

What is claimed is:

1. An electronic component, comprising:
an electronic device; and
a package that houses the electronic device,
wherein the package includes
a base body to which the electronic device is fixed,
a lid body that faces the electronic device, and
a frame body that encloses a space between the lid body and the base body,
wherein the base body includes
a fiducial stage part having a terminal arranged thereon, the terminal being electrically connected with the electronic device, and
an upper stage part located at a side of an outer edge of the package with respect to the fiducial stage part and protruding with respect to the fiducial stage part through a step part, and
wherein the frame body is bonded to the upper stage part, and an inner edge of the frame body is located at the side of the outer edge of the package with respect to the step part.

2. The electronic component according to claim 1, further comprising:
a jointing material that bonds the base body and the frame body, the jointing material including
a portion located between the base body and the frame body, and
a portion located on a region of the upper stage part, at a side of the step part with respect to the inner edge.

3. The electronic component according to claim 1, wherein an outer edge of the base body is located at a side of the inner edge with respect to an outer edge of the frame body.

4. The electronic component according to claim 1, wherein a distance between the inner edge and the step part is equal to or greater than a distance between the fiducial stage part and the upper stage part.

5. The electronic component according to claim 1, wherein the base body includes a lower stage part that is recessed with respect to the fiducial stage part, and the electronic device is bonded to the lower stage part.

6. The electronic component according to claim 1, wherein the upper stage part is located at a position farther from the lid body than a position of a facing surface of the electronic device facing the lid body.

7. The electronic component according to claim 1, wherein the frame body includes an extension part that extends from between the base body and the lid body toward the side of the outer edge of the package, and the extension part has a through hole.

8. The electronic component according to claim 1, wherein the base body, the lid body, and the frame body are made of different materials.

9. The electronic component according to claim 1,
wherein a material of the base body is ceramic,
wherein a material of the frame body is metal, and
wherein the lid body is transparent to visible light.

10. The electronic component according to claim 1, wherein a surface roughness of the frame body is greater than a surface roughness of at least one of the base body and the lid body.

11. The electronic component according to claim 1, wherein a spherical particle is interposed between the frame body and the lid body.

12. An electronic apparatus, comprising:
the electronic component according to claim 1, and
a wiring member to which the electronic component is fixed.

13. A mounting member having a region for disposing an electronic device thereon, comprising:
a base body having the region; and
a frame body having an opening corresponding to the region, the frame body being bonded to the base body,
wherein the base body includes,
a fiducial stage part having a terminal arranged thereon, the terminal being electrically connected with the electronic device, and
an upper stage part located at a side of an outer edge of the mounting member with respect to the fiducial stage part and protruding with respect to the fiducial stage part through a step part, and
wherein the frame body is bonded to the upper stage part, and an inner edge of the frame body is located at the side of the outer edge of the mounting member with respect to the step part.

14. The mounting member according to claim 13, further comprising:
a jointing material that bonds the base body and the frame body, the jointing material including
a portion located between the base body and the frame body, and
a portion located on a region of the upper stage part, at a side of the step part with respect to the inner edge.

15. The mounting member according to claim 13, wherein an outer edge of the base body is located at a side of the inner edge with respect to an outer edge of the frame body.

16. A manufacturing method of a mounting member having a region for disposing an electronic device thereon, comprising:
preparing a base body having the region and a frame body having an opening corresponding to the region; and
bonding the base body and the frame body with an adhesive,
wherein the base body includes, a fiducial stage part having a terminal arranged thereon, the terminal being electrically connected with the electronic device, and an upper stage part located at a side of an outer edge of the base body with respect to the fiducial stage part and protruding with respect to the fiducial stage part through a step part, and wherein, in the bonding, the frame body is bonded to the upper stage part so that an inner edge of the frame body is located at the side of the outer edge of the base body with respect to the step part.

17. The manufacturing method of the mounting member according to claim 16, wherein, in the bonding of the frame body, the adhesive is applied to the frame body.

18. A manufacturing method of an electronic component including an electronic device and a lid body that faces the electronic device, comprising:

preparing the mounting member manufactured by the manufacturing method of the mounting member according to claim 16;

mounting the electronic device on the mounting member; and bonding the lid body and the frame body with an adhesive.

19. The manufacturing method of the electronic component according to claim 18, wherein, in the bonding of the lid body, the adhesive is applied to the lid body.

20. A manufacturing method of an electronic apparatus, comprising fixing the electronic component according to claim 1 to a wiring member by reflow soldering.

\* \* \* \* \*